(12) United States Patent
Tsai

(10) Patent No.: US 11,978,785 B2
(45) Date of Patent: May 7, 2024

(54) METHOD OF MANUFACTURING SEMICONDUCTOR STRUCTURE HAVING A FIN FEATURE

(71) Applicant: NANYA TECHNOLOGY CORPORATION, New Taipei (TW)

(72) Inventor: Jhen-Yu Tsai, Kaohsiung (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 236 days.

(21) Appl. No.: 17/554,102

(22) Filed: Dec. 17, 2021

(65) Prior Publication Data

US 2023/0197832 A1  Jun. 22, 2023

(51) Int. Cl.
  *H01L 29/66* (2006.01)
  *H01L 21/762* (2006.01)
  *H01L 21/8234* (2006.01)
  *H01L 29/78* (2006.01)

(52) U.S. Cl.
  CPC .. *H01L 29/66818* (2013.01); *H01L 21/76232* (2013.01); *H01L 21/823431* (2013.01); *H01L 29/785* (2013.01)

(58) Field of Classification Search
  CPC ......... H01L 29/66818; H01L 21/76232; H01L 21/823431; H01L 29/785; H01L 21/76224; H01L 2924/1436–14369; H01L 28/40–92; H10B 12/05–056; H10B 12/10; G11C 11/401–4099; G11C 14/0009–0045; G11C 2211/4016; G11C 5/06–10
  See application file for complete search history.

(56) References Cited

U.S. PATENT DOCUMENTS

| | | | |
|---|---|---|---|
| 9,178,051 B2 | 11/2015 | Yu | |
| 2012/0256259 A1 | 10/2012 | Surthi et al. | |
| 2013/0320558 A1 | 12/2013 | Kim et al. | |
| 2014/0054721 A1* | 2/2014 | Nam | H01L 21/76224 |
| | | | 257/401 |
| 2017/0103985 A1 | 4/2017 | Kim et al. | |
| 2017/0317084 A1* | 11/2017 | Cantoro | H01L 21/823431 |
| 2018/0005830 A1 | 1/2018 | Laven et al. | |
| 2019/0267280 A1* | 8/2019 | Xu | H01L 21/76224 |
| 2023/0140124 A1 | 5/2023 | Wan | |

FOREIGN PATENT DOCUMENTS

TW  202117933 A  5/2021

OTHER PUBLICATIONS

Office Action mailed on Feb. 2, 2023 related to Taiwanese Application No. 111107972.
Office Action mailed on Oct. 5, 2023 related to U.S. Appl. No. 17/554,813.

* cited by examiner

*Primary Examiner* — Cuong B Nguyen
(74) *Attorney, Agent, or Firm* — Xuan Zhang

(57) ABSTRACT

A method of manufacturing a semiconductor structure is provided. The method includes providing a semiconductor substrate having an active region, forming a fin structure in the active region, and forming a conductive element on the body portion and the first tapered portion of the fin structure. The fin structure includes a body portion, and a first tapered portion protruding from an upper surface of the body portion.

18 Claims, 19 Drawing Sheets

METHOD OF MANUFACTURING SEMICONDUCTOR STRUCTURE HAVING A FIN FEATURE

TECHNICAL FIELD

The present disclosure relates to a method of manufacturing a semiconductor structure, and more particularly, to a method of manufacturing a semiconductor structure having a fin feature.

DISCUSSION OF THE BACKGROUND

With the rapid growth of electronic industry, the development of semiconductor devices has achieved high performance and miniaturization. As the size of semiconductor devices, such as dynamic random access memory (DRAM) devices, is reduced, short channel effect may occur. To deal with such problems, a buried-channel array transistor (BCAT) device has been proposed.

However, although the recessed channel of the BCAT device improves the short channel effect, the BCAT device suffers from other issues, such as decreased threshold voltage (Vth) and current leakage, adversely affecting performance and stability of the semiconductor device.

This Discussion of the Background section is provided for background information only. The statements in this Discussion of the Background are not an admission that the subject matter disclosed herein constitutes prior art with respect to the present disclosure, and no part of this Discussion of the Background may be used as an admission that any part of this application constitutes prior art with respect to the present disclosure.

SUMMARY

One aspect of the present disclosure provides a semiconductor structure including a semiconductor substrate. The semiconductor substrate has an active region defined by an isolation structure. A trench passes through the active region and the isolation structure. The active region of the semiconductor substrate includes a fin structure in the trench. The fin structure includes a first protrusion extending upwards along a first sidewall of the trench.

Another aspect of the present disclosure provides a semiconductor structure including a semiconductor substrate and a conductive element. The semiconductor substrate has an active region including a fin structure. The fin structure includes a body portion and a first tapered portion. The first tapered portion protrudes from an upper surface of the body portion. The conductive element is disposed on the body portion and the first tapered portion of the fin structure.

Another aspect of the present disclosure provides a method of manufacturing a semiconductor structure. The method includes providing a semiconductor substrate having an active region. The method also includes removing a portion of the active region of the semiconductor substrate to form a trench and an initial fin structure. The method further includes removing a portion of the initial fin structure to form a fin structure including a first protrusion extending upwards along a first sidewall of the trench.

In the design of a fin structure including a protrusion extending upwards along a sidewall of a trench in which the fin structure is formed, the protrusion can provide an extension of the fin structure that can be further covered by a conductive element. Since the electric field is relatively high adjacent to the sidewall of the trench (i.e., where a doped region or a source/drain region of a cell transistor is located), the protrusion covered by the conductive element can increase the area covered by the conductive element (i.e., the gate control region). Therefore, an additional gate control region can be generated, and the gate control over the channel of the semiconductor structure (i.e. the transistor) can be improved.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures, and:

DETAILED DESCRIPTION

Figure 1A:
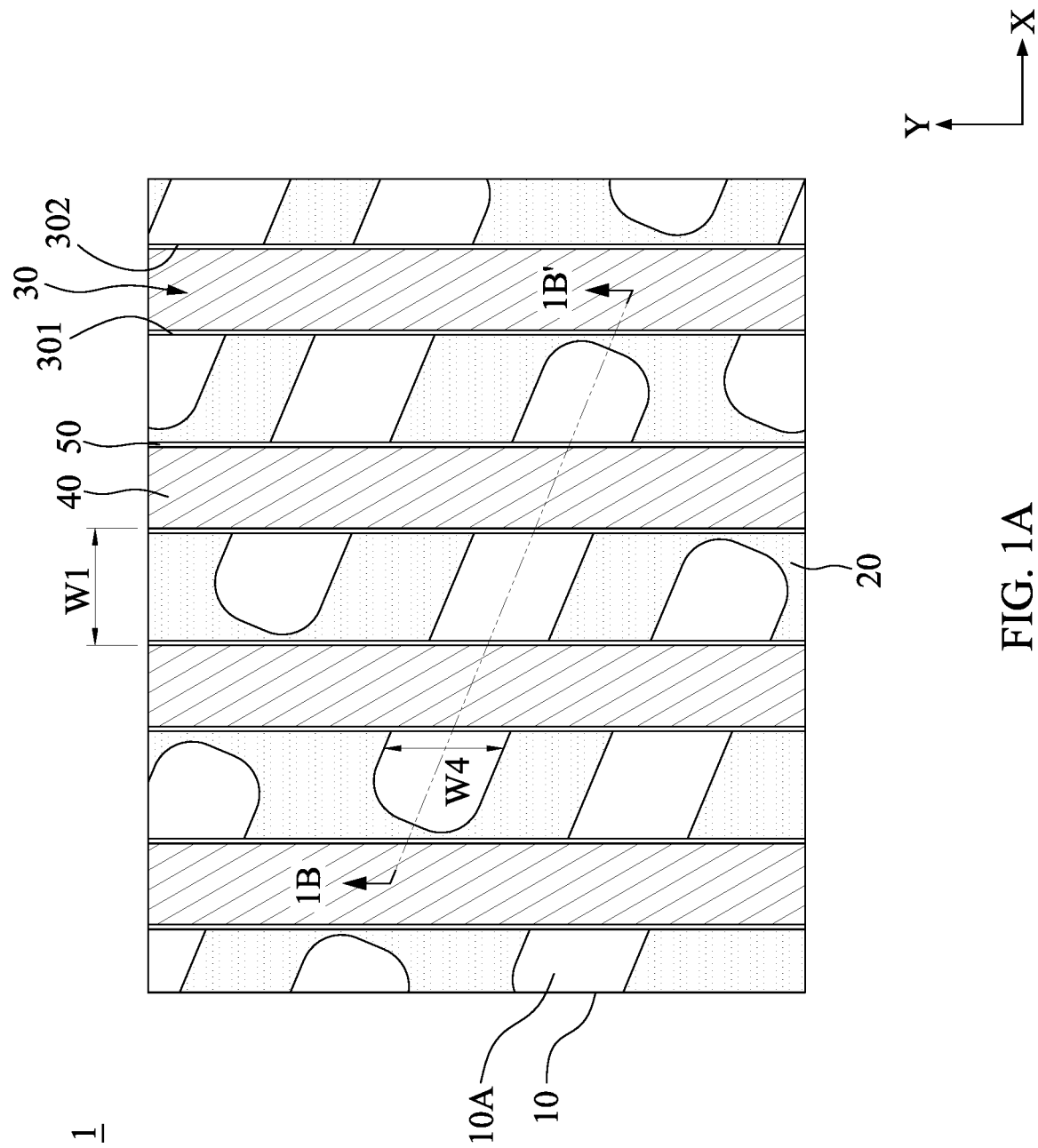
FIG. 1A is a top view of a semiconductor structure, in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc., may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

Figure 1B:
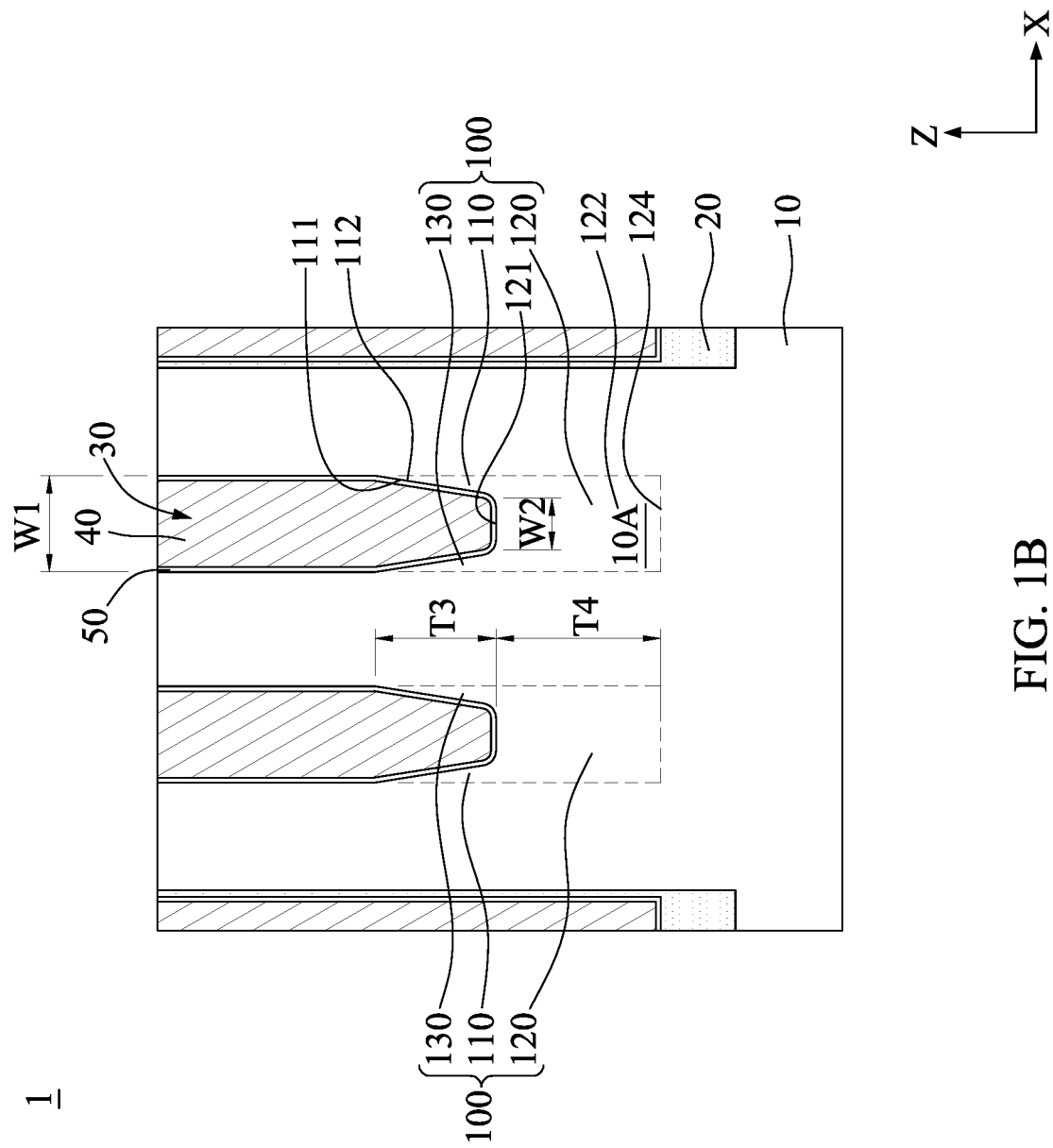
FIG. 1B is a cross-section of a semiconductor structure, in accordance with some embodiments of the present disclosure.
Figure 1C:
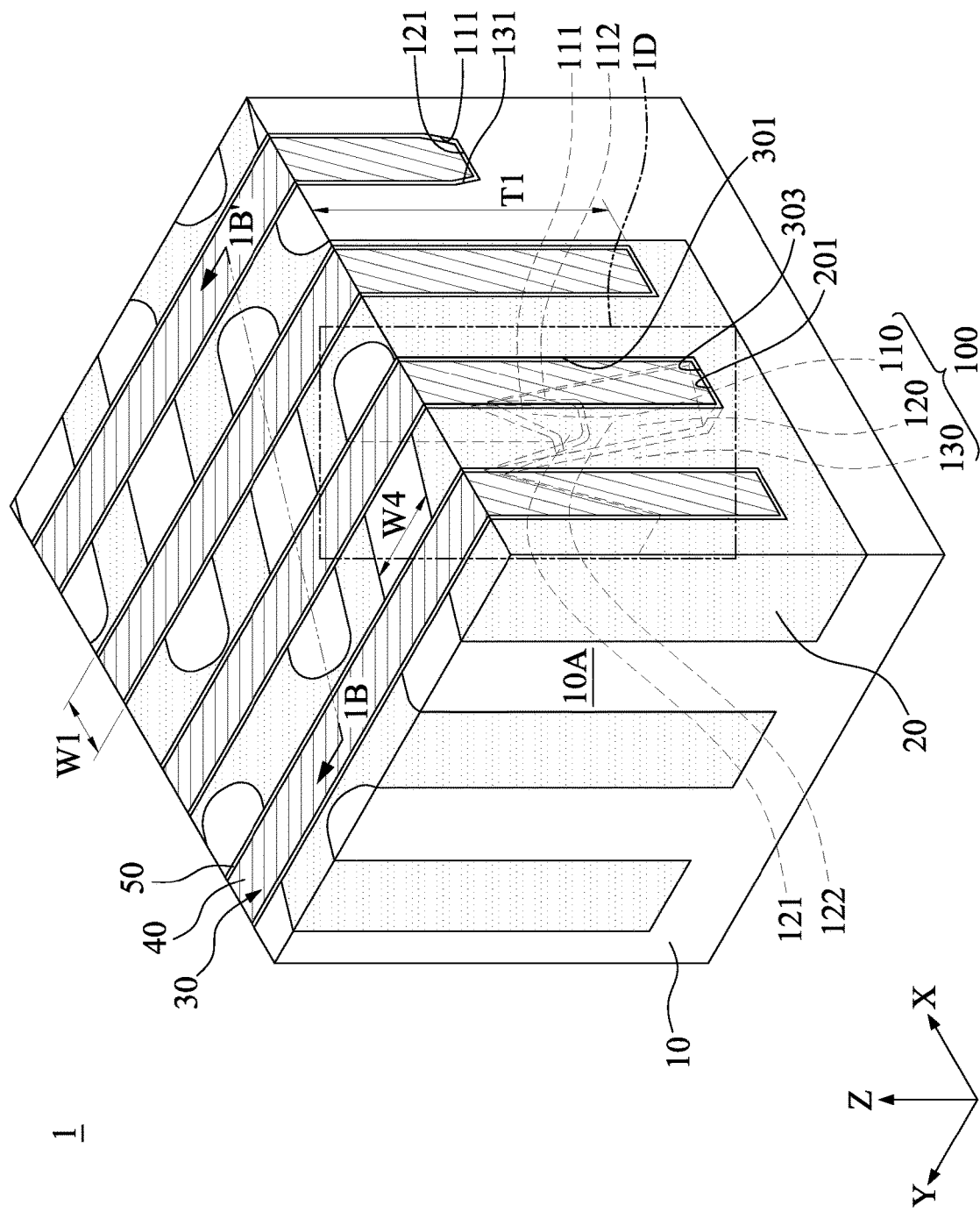
FIG. 1C is a three-dimensional view of a semiconductor structure, in accordance with some embodiments of the present disclosure.
Figure 1D:
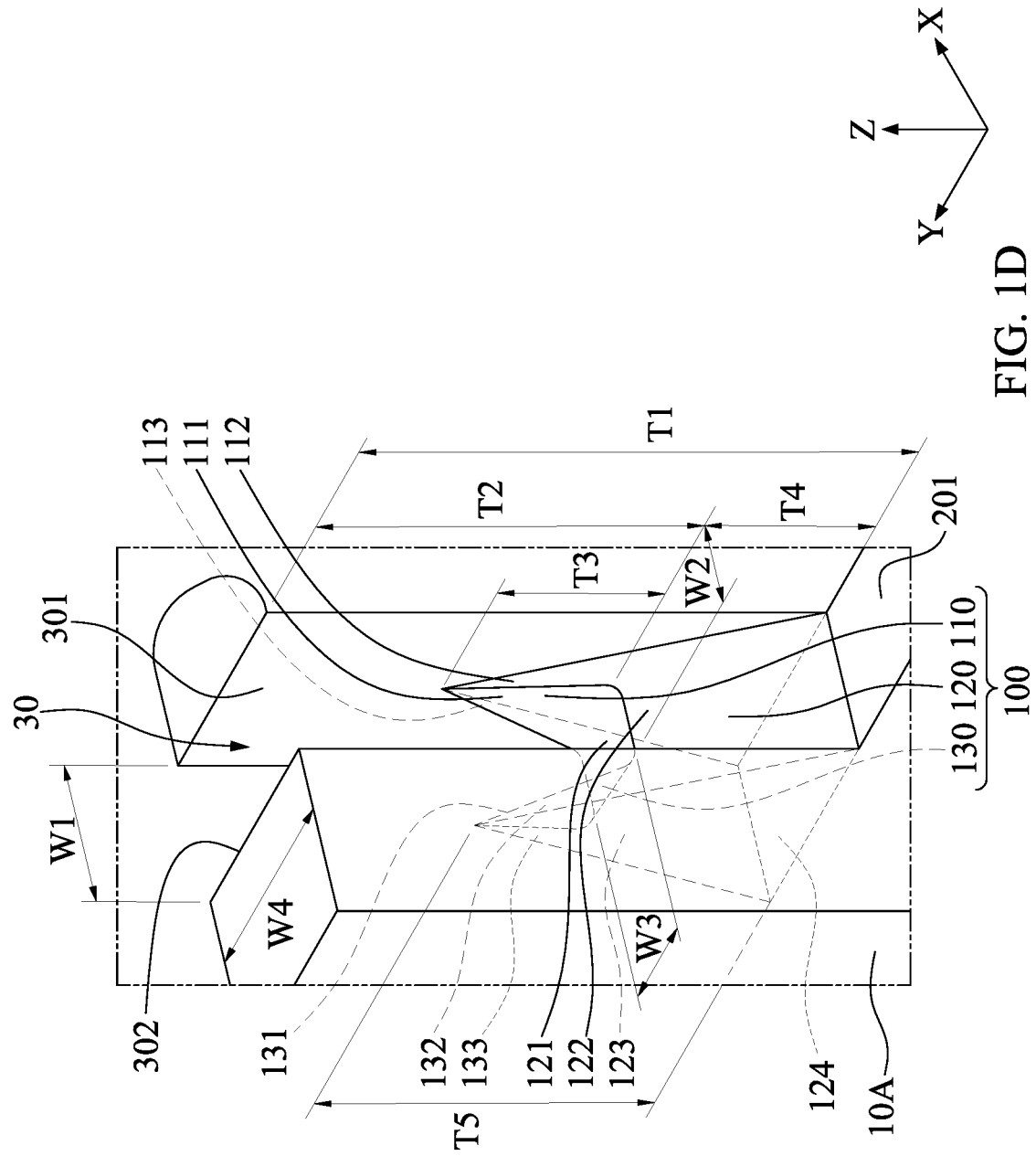
FIG. 1D is a perspective view of a portion of a semiconductor structure, in accordance with some embodiments of the present disclosure.

FIG. 1A is a top view of a semiconductor structure 1, in accordance with some embodiments of the present disclosure, FIG. 1B is a cross-section of a semiconductor structure 1, in accordance with some embodiments of the present disclosure, FIG. 1C is a three-dimensional view of a semiconductor structure 1, in accordance with some embodiments of the present disclosure, and FIG. 1D is a perspective view of a portion 1D of a semiconductor structure 1, in accordance with some embodiments of the present disclosure. The semiconductor structure 1 includes a semiconductor substrate 10, an isolation structure 20, one or more trenches 30, one or more conductive elements 40, and one or more dielectric layers 50.

FIG. 1B is a cross-section along line 1B-1B' of FIG. 1A. In some embodiments, FIG. 1B is a cross-section along line 1B-1B' of FIG. 1C. It should be noted that some elements (e.g., the conductive element 40 and the dielectric layer 50) are omitted from FIG. 1D for clarity.

The semiconductor substrate 10 may include one or more active regions 10A defined by the isolation structure 20. In some embodiments, the active regions 10A of the semiconductor substrate 10 are adjacent to and defined by the isolation structure 20. The semiconductor substrate 10 may be formed of or include, for example, silicon, doped silicon, silicon germanium, silicon on insulator, silicon on sapphire, silicon germanium on insulator, silicon carbide, germanium, gallium arsenide, gallium phosphide, gallium arsenide phosphide, indium phosphide, indium gallium phosphide, or any other Tv-Tv, III-V or I-VI semiconductor material.

The isolation structure 20 may be formed of or include an insulating material such as silicon oxide, silicon nitride, silicon oxynitride, or a combination thereof.

The trenches 30 may pass through the active regions 10A and the isolation structure 20. In some embodiments, the trench 30 extends along a Y axis (or Y direction), and the trench 30 has a width W1 along an X axis (or X direction). In some embodiments, the trench 30 has a sidewall 301 and a sidewall 302 opposite to the sidewall 301. The width W1 is the distance between the sidewall 301 and the sidewall 302. In some embodiments, the width W1 of the trench 30 is from about 20 nm to about 30 nm. In some embodiments, the trench 30 has a depth T1. In some embodiments, the depth T1 of the trench 30 is from about 20 nm to about 150 nm.

In some embodiments, the trench 30 includes one or more trench portions in one or more active regions 10A and one or more trench portions in the isolation structure 20. In some embodiments, the trench portion in the active region 10A is connected to the trench portion in the isolation structure 20. In some embodiments, the trench portion in the active region 10A has a length W4 along the extending direction (also referred to as "a longitudinal orientation") (e.g., the Y axis) of the trench 30. In some embodiments, the length W4 of the trench portion of the trench 30 in the active region 10A is from about 5 nm to about 30 nm.

In some embodiments, the active region 10A of the semiconductor substrate 10 may further include doped regions adjacent to the sidewalls 301 and 302 of the trench 30. The doped regions may be adjacent to the trench portions of the trench 30 in the active region 10A. The doped regions may be source/drain regions.

In some embodiments, the active region 10A of the semiconductor substrate 10 includes one or more fin structures 100 in the trench 30. In some embodiments, the fin structure 100 includes a body portion 120 and protrusions 110 and 130. In some embodiments, the body portion 120 is connected to the protrusions 110 and 130.

Referring to FIGS. 1B-1D, the body portion 120 of the fin structure 100 may have an upper surface 121, a bottom surface 124 (also referred to as "an underside surface") opposite to the upper surface 121, and slanted surfaces 122 and 123 (also referred to as "slanted lateral surfaces"). In some embodiments, an area of the upper surface 121 is less than an area of the bottom surface 124. In some embodiments, the slanted surface 122 of the body portion 120 extends from the upper surface 121 to the bottom surface 124. In some embodiments, the slanted surface 123 of the body portion 120 extends from the upper surface 121 to the bottom surface 124. In some embodiments, the slanted surface 122 of the body portion 120 extends from the upper surface 121 to a bottom 303 (also referred to as "a bottom surface" or "an underside surface") of the trench 30. In some embodiments, the slanted surface 123 of the body portion 120 extends from the upper surface 121 to the bottom 303 of the trench 30.

In some embodiments, the upper surface 121 of the body portion 120 has a width W2 along the X axis. In some embodiments, a ratio (W2/W1) of the width W2 of the upper surface 121 of the body portion 120 to the width W1 of the trench 30 equals or exceeds about 0.5. In some embodiments, a ratio (W2/W1) of the width W2 of the upper surface 121 of the body portion 120 to the width W1 of the trench 30 equals or exceeds about 0.6. In some embodiments, a ratio (W2/W1) of the width W2 of the upper surface 121 of the body portion 120 to the width W1 of the trench 30 equals or exceeds about 0.7. In some embodiments, a ratio (W2/W1) of the width W2 of the upper surface 121 of the body portion 120 to the width W1 of the trench 30 equals or exceeds about 0.8.

In some embodiments, the upper surface 121 of the body portion 120 has a length W3 along the extending direction (e.g., the Y axis) of the trench 30. In some embodiments, the length W3 may extend along a direction (e.g., the Y axis) substantially perpendicular to the direction (e.g., the X axis) along which the width W2 extends. In some embodiments, a ratio (W3/W4) of the length W3 of the upper surface 121 of the body portion 120 to the length W4 of the trench portion of the trench 30 in the active region 10A equals or exceeds about 0.5. In some embodiments, a ratio (W3/W4) of the length W3 of the upper surface 121 of the body portion 120 to the length W4 of the trench portion of the trench 30 in the active region 10A equals or exceeds about 0.6. In some embodiments, a ratio (W3/W4) of the length W3 of the upper surface 121 of the body portion 120 to the length W4 of the trench portion of the trench 30 in the active region 10A equals or exceeds about 0.7. In some embodiments, a ratio (W3/W4) of the length W3 of the upper surface 121 of the body portion 120 to the length W4 of the trench portion of the trench 30 in the active region 10A equals or exceeds about 0.8.

In some embodiments, the body portion 120 has a thickness T4. The thickness T4 of the body portion 120 may be defined by a vertical distance between the upper surface 121 and the bottom surface 124 of the body portion 120. In some embodiments, the thickness T4 is from about 10 nm to about 100 nm. In some embodiments, a ratio (T4/T1) of the thickness T4 of the body portion 120 to the depth T1 of the trench 30 equals or is less than about 0.5. In some embodiments, a ratio (T4/T1) of the thickness T4 of the body portion 120 to the depth T1 of the trench 30 equals or is less than about 0.4. In some embodiments, a ratio (T4/T1) of the thickness T4 of the body portion 120 to the depth T1 of the trench 30 equals or is less than about 0.3.

In some embodiments, an opening of the trench 30 may be spaced apart from the upper surface 121 of the body portion 120 by a distance T2. In some embodiments, the distance T2 is from about 10 nm to about 100 nm.

In some embodiments, a portion of the isolation structure 20 is in the trench 30 and has an upper surface 201, and the slanted surface 122 of the body portion 120 extends from the upper surface 121 of the body portion 120 to the upper surface 201 of the isolation structure 20 in the trench 30. In some embodiments, the slanted surface 123 of the body portion 120 extends from the upper surface 121 of the body portion 120 to the upper surface 201 of the isolation structure 20 in the trench 30.

In some embodiments, the protrusion 110 of the fin structure 100 protrudes from the upper surface 121 of the body portion 120. In some embodiments, the protrusion 110 extends upwards along the sidewall 301 of the trench 30. In some embodiments, the protrusion 110 includes a plurality of slanted surfaces (e.g., slanted surfaces 111, 112, and 123). In some embodiments, the slanted surface 111 of the protrusion 110 is connected to the upper surface 121 of the body portion 120. In some embodiments, the slanted surface 112 of the protrusion 110 is connected to the slanted surface 122 of the body portion 120. In some embodiments, the slanted surface 113 of the protrusion 110 is connected to the slanted surface 123 of the body portion 120. In some embodiments, the protrusion 110 may be tapered or may include a tapered portion. In some embodiments, the protrusion 110 is tapered or has a tapered shape.

In some embodiments, the protrusion 110 has a thickness T3. The thickness T3 of the protrusion 110 may be defined by a vertical distance between a bottommost surface and a topmost surface or end point of the protrusion 110. The bottommost surface of the protrusion 110 may be at the same elevation as the upper surface 121 of the body portion 120. In some embodiments, the thickness T3 of the protrusion 110 is from about 5 nm to about 50 nm. In some embodiments, a ratio (T3/T2) of the thickness T3 of the protrusion 110 to the distance T2 between the opening of the trench 30 and the upper surface 121 of the body portion 120 equals or is less than about 0.5. In some embodiments, a ratio (T3/T2) of the thickness T3 of the protrusion 110 to the distance T2 between the opening of the trench 30 and the upper surface 121 of the body portion 120 equals or is less than about 0.4. In some embodiments, a ratio (T3/T2) of the thickness T3 of the protrusion 110 to the distance T2 between the opening of the trench 30 and the upper surface 121 of the body portion 120 equals or is less than about 0.3.

In some embodiments, the protrusion 130 of the fin structure 100 protrudes from the upper surface 121 of the body portion 120. In some embodiments, the protrusion 130 extends upwards along the sidewall 302 of the trench 30. In some embodiments, the protrusion 130 includes a plurality of slanted surfaces (e.g., slanted surfaces 131, 132, and 133). In some embodiments, the slanted surface 131 of the protrusion 130 faces the slanted surface 111 of the protrusion 110. In some embodiments, the slanted surface 131 of the protrusion 130 is connected to the upper surface 121 of the body portion 120. In some embodiments, the slanted surface 132 of the protrusion 130 is connected to the slanted surface 122 of the body portion 120. In some embodiments, the slanted surface 133 of the protrusion 130 is connected to the slanted surface 123 of the body portion 120. In some embodiments, the protrusion 130 may be tapered or may include a tapered portion. In some embodiments, the protrusion 130 is tapered or has a tapered shape.

In some embodiments, the protrusion 130 has a thickness T5. The thickness T5 of the protrusion 130 may be defined by a vertical distance between a bottommost surface and a topmost surface or end point of the protrusion 130. The bottommost surface of the protrusion 130 may be at the same elevation as the upper surface 121 of the body portion 120. In some embodiments, the thickness T5 of the protrusion 130 is from about 5 nm to about 50 nm. In some embodiments, a ratio (T5/T2) of the thickness T5 of the protrusion 130 to the distance T2 between the opening of the trench 30 and the upper surface 121 of the body portion 120 equals or is less than about 0.5. In some embodiments, a ratio (T5/T2) of the thickness T5 of the protrusion 130 to the distance T2 between the opening of the trench 30 and the upper surface 121 of the body portion 120 equals or is less than about 0.4. In some embodiments, a ratio (T5/T2) of the thickness T5 of the protrusion 130 to the distance T2 between the opening of the trench 30 and the upper surface 121 of the body portion 120 equals or is less than about 0.3.

In some embodiments, the protrusion 110 and the protrusion 130 are located at two opposite sides of the upper surface 121 of the body portion 120. In some embodiments, the protrusions 110 and 130 protrude along the same direction or orientation (e.g., the Z axis). In some embodiments, the slanted surface 112 of the protrusion 110, the slanted surface 132 of the protrusion 130, and the slanted surface 122 of the body portion 120 form a continuous plane or surface. In some embodiments, the slanted surface 113 of the protrusion 110, the slanted surface 133 of the protrusion 130, and the slanted surface 123 of the body portion 120 form a continuous plane or surface.

The conductive element 40 may be disposed on the protrusion 110 of the fin structure 100 in the trench 30. In some embodiments, the conductive element 40 is disposed on the protrusions 110 and 130 of the fin structure 100 in the trench 30. In some embodiments, the conductive element 40 is disposed on the body portion 120 and the protrusions 110 and 130 of the fin structure 100 in the trench 30. In some embodiments, the conductive element 40 is conformally formed on the slanted surfaces (e.g., the slanted surfaces 111, 112, and 113) of the protrusion 110. In some embodiments, the conductive element 40 completely covers the slanted surfaces (e.g., the slanted surfaces 111, 112, and 113) of the protrusion 110. In some embodiments, the conductive element 40 is conformally formed on the slanted surfaces (e.g., the slanted surfaces 131, 132, and 133) of the protrusion 130. In some embodiments, the conductive element 40 completely covers the slanted surfaces (e.g., the slanted surfaces 131, 132, and 133) of the protrusion 130. In some embodiments, the conductive element 40 is conformally formed on the slanted surfaces (e.g., the slanted surfaces 122 and 123) of the body portion 120. In some embodiments, the conductive element 40 includes a conductive material, for example, doped polysilicon, a metal, or a metal silicide. The metal may be, for example, aluminum, copper, tungsten, cobalt, or an alloy thereof. The metal silicide may be, for example, nickel silicide, platinum silicide, titanium silicide, molybdenum silicide, cobalt silicide, tantalum silicide, tungsten silicide, or the like. In some embodiments, the conductive element 40 may be or include a word line.

The dielectric layer 50 may be disposed between the conductive element 40 and the protrusion 110 of the fin structure 100. In some embodiments, the dielectric layer 50 is disposed between the conductive element 40 and the protrusions 110 and 130 of the fin structure 100 in the trench 30. In some embodiments, the dielectric layer 50 is disposed between the conductive element 40 and the body portion 120 and the protrusions 110 and 130 of the fin structure 100 in the trench 30. In some embodiments, the dielectric layer 50 is conformally formed on the slanted surfaces (e.g., the slanted surfaces 111, 112, and 113) of the protrusion 110. In some embodiments, the dielectric layer 50 completely covers the slanted surfaces (e.g., the slanted surfaces 111, 112, and 113) of the protrusion 110. In some embodiments, the dielectric layer 50 is conformally formed on the slanted surfaces (e.g., the slanted surfaces 131, 132, and 133) of the protrusion 130. In some embodiments, the dielectric layer 50 completely covers the slanted surfaces (e.g., the slanted surfaces 131, 132, and 133) of the protrusion 130. In some embodiments, the dielectric layer 50 is conformally formed on the slanted surfaces (e.g., the slanted surfaces 122 and 123) of the body portion 120. In some embodiments, the dielectric layer 50 may be formed of or include, for example, silicon oxide, silicon nitride, silicon oxynitride, silicon nitride oxide, fluoride-doped silicate, or a high-k material, or the like. In some embodiments, the dielectric layer 50 may be formed of or include, barium strontium titanate, lead zirconium titanate, titanium oxide, aluminum oxide, hafnium oxide, yttrium oxide, zirconium oxide, or the like. In some embodiments, the dielectric layer 50 may be or include a word line insulating layer.

In some embodiments, in the design of the fin structure 100, the subthreshold swing of a cell transistor in the semiconductor structure 1 can be reduced by about 10 mV/dec to about 20 mV/dec. In some embodiments, in the design of the fin structure 100, the subthreshold swing of a cell transistor in the semiconductor structure 1 can be reduced by about 10% to about 20%. In some embodiments, in the design of the fin structure 100, the threshold voltage of a cell transistor in the semiconductor structure 1 can be reduced by about 20 mV. Accordingly, the gate control over the cell transistor in the semiconductor structure 1 can be increased, the formation time of a channel can be reduced, and thus the switching speed of the cell transistor in the semiconductor structure 1 can be increased. In addition, current leakage can be mitigated or prevented, and electrical performance of the semiconductor structure 1 thus can be improved.

According to some embodiments of the present disclosure, in the design of the fin structure 100 including the protrusion 110 extending upwards along the sidewall 301 of the trench 30, the protrusion 110 can provide an extension of the fin structure 100 that can be further covered by the conductive element 40. Since the electric field is relatively high adjacent to the sidewall 301 of the trench 30 (i.e., where a doped region or a source/drain region of a cell transistor is located), the protrusion 110 covered by the conductive element 40 can increase the area covered by the conductive element 40 (i.e., the gate control region). Therefore, an additional gate control region can be generated, and gate control over the channel of the semiconductor structure (i.e. the transistor) can be improved.

In addition, if the upper surface 121 of the body portion 120 of the fin structure 100 is too small, space for filling the conductive element 40 in the trench 30 and contacting the fin structure 100 may be relatively insufficient, whereby resistance of the conductive element 40 may be undesirably increased. In contrast, according to some embodiments of the present disclosure, with the aforesaid ratio (W2/W1) of the width W2 of the upper surface 121 of the body portion 120 to the width W1 of the trench 30, e.g., at least equaling or exceeding about 0.5, the as-formed conductive element 40 can have sufficient volume and width. Accordingly, resistance of the conductive element 40 is not undesirably increased, and conductivity of the conductive element 40 can be protected from adverse effect.

FIGS. 2A, 2B, 3A, 3B, 4A, 4B, 5A, 5B, 6A, 6B, 7A, 7B, 7A, and 8B illustrate various stages of a method of manufacturing a semiconductor structure 1, in accordance with some embodiments of the present disclosure.

Figure 2A:
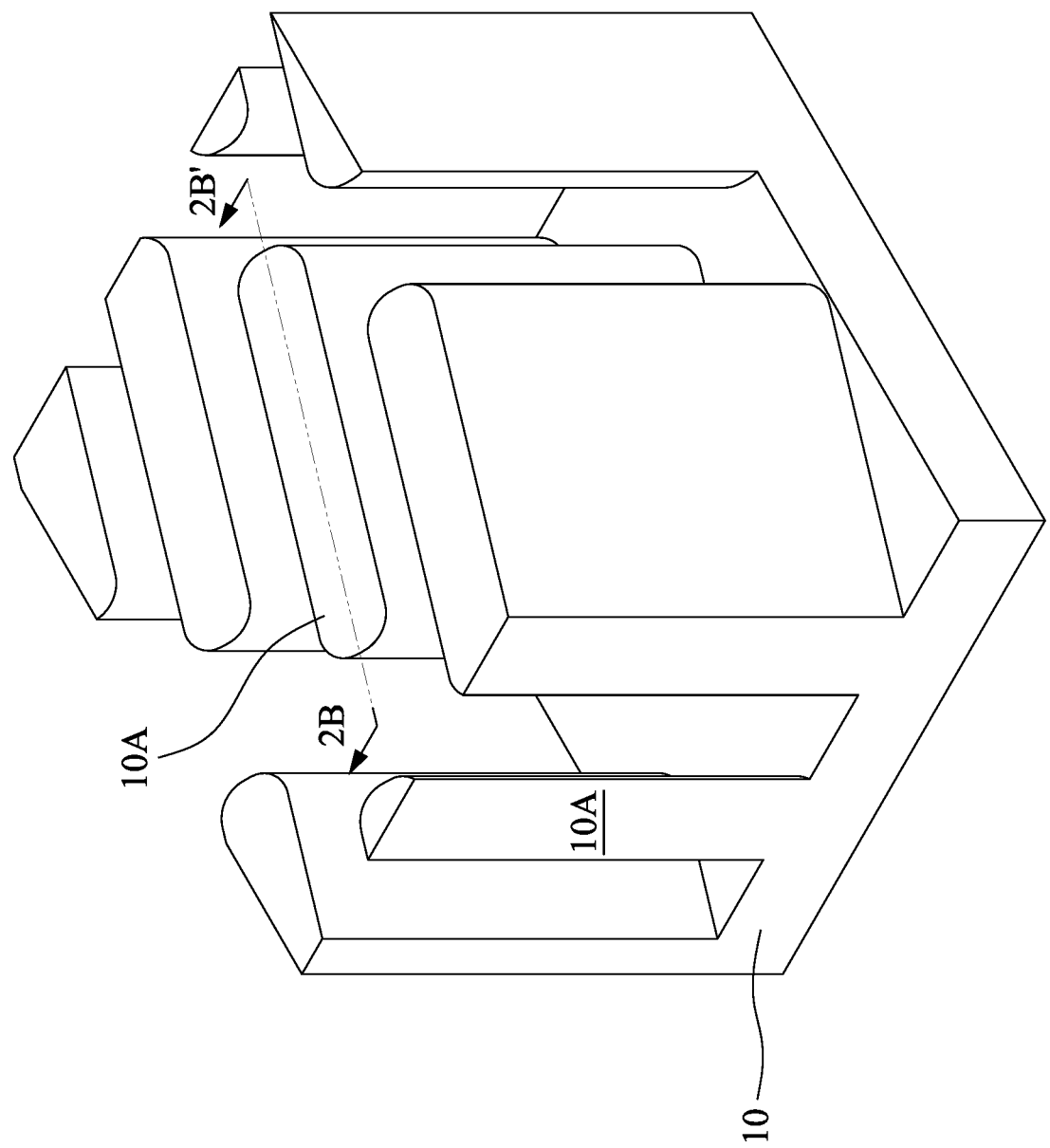
FIGS. 2A-2B illustrate one stage of a method of manufacturing a semiconductor structure, in accordance with some embodiments of the present disclosure.
Figure 2B:
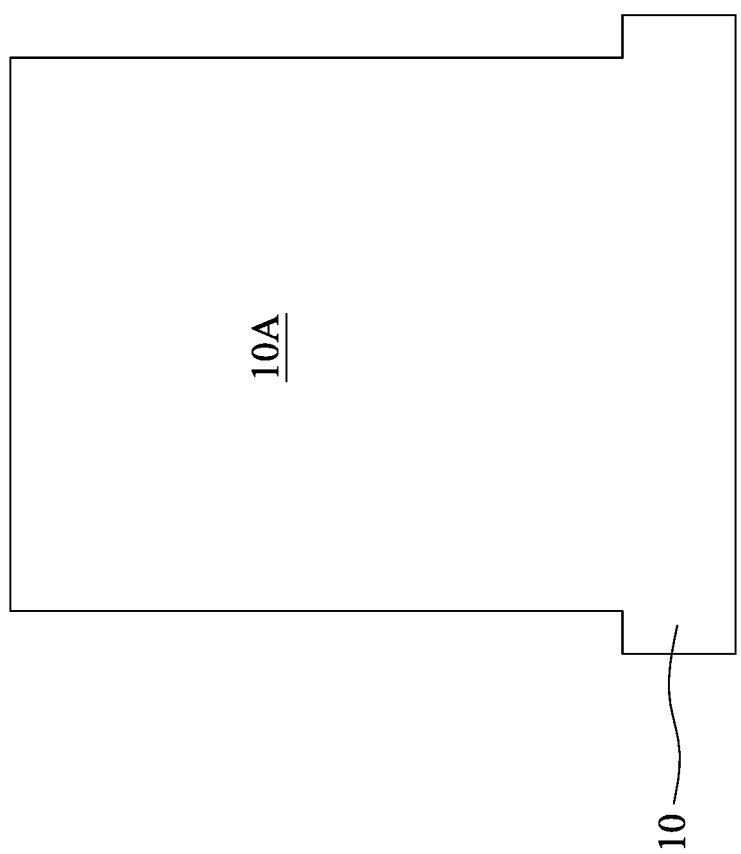

FIGS. 2A-2B illustrate one stage of a method of manufacturing a semiconductor structure 1, in accordance with some embodiments of the present disclosure. In some embodiments, FIG. 2B is a cross-section 2B-2B' of FIG. 2A.

A substrate 10 having active regions 10A may be provided. The semiconductor substrate 10 may be formed of, for example, silicon, doped silicon, silicon germanium, silicon on insulator, silicon on sapphire, silicon germanium on insulator, silicon carbide, germanium, gallium arsenide, gallium phosphide, gallium arsenide phosphide, indium phosphide, indium gallium phosphide, or any other IV-IV, III-V or I-VI semiconductor material.

Photolithography may be performed to pattern the semiconductor substrate 10 to define positions of the plurality of active regions 10A. Etching may be performed after the photolithography process to form a plurality of trenches in the semiconductor substrate 10.

Figure 3A:
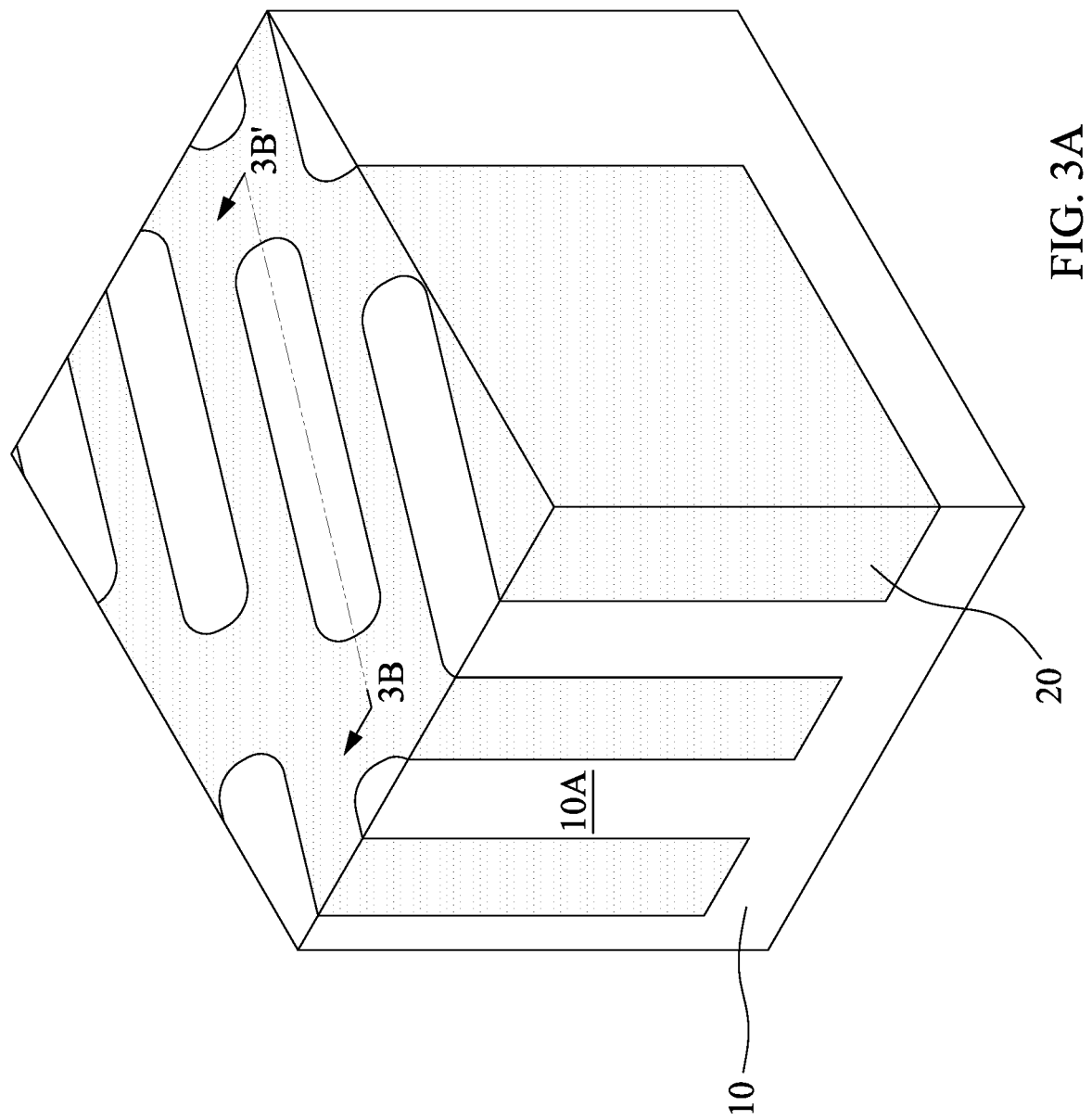
FIGS. 3A-3B illustrate one stage of a method of manufacturing a semiconductor structure, in accordance with some embodiments of the present disclosure.
Figure 3B:
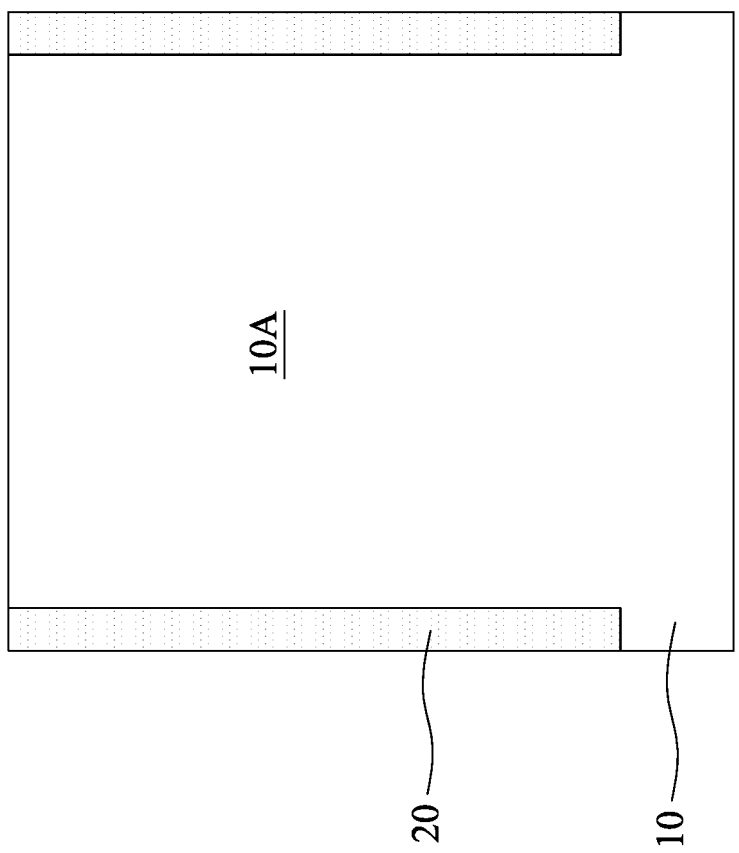

FIGS. 3A-3B illustrate one stage of a method of manufacturing a semiconductor structure 1, in accordance with some embodiments of the present disclosure. In some embodiments, FIG. 3B is a cross-section along the line 3B-3B' of FIG. 3A.

An isolation structure 20 may be formed in the semiconductor substrate 10, and a plurality of active regions 10A of the semiconductor substrate 10 may be defined by the isolation structure 20.

After etching to form the plurality of trenches in the semiconductor substrate 10, an insulating material such as silicon oxide, silicon nitride, silicon oxynitride, silicon nitride oxide, or fluoride-doped silicate, may be used to fill the plurality of trenches of the semiconductor substrate 10 by deposition. Planarization, such as chemical mechanical polishing, may be performed after the deposition process to remove excess material and provide a substantially flat surface for subsequent processing steps and conformally form the isolation structure 20 and the plurality of active regions 10A.

Figure 4A:
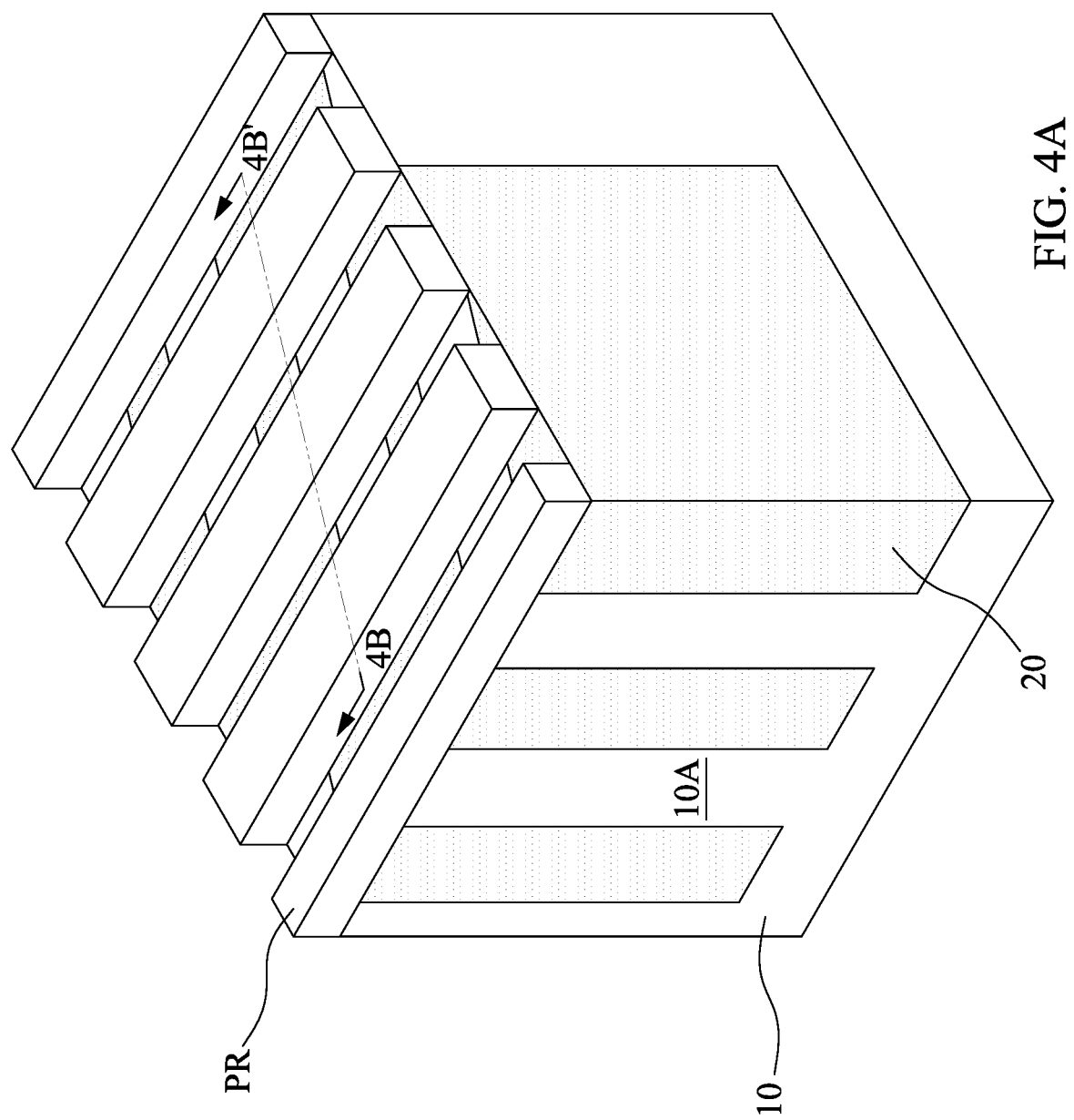
FIGS. 4A-4B illustrate one stage of a method of manufacturing a semiconductor structure, in accordance with some embodiments of the present disclosure.
Figure 4B:
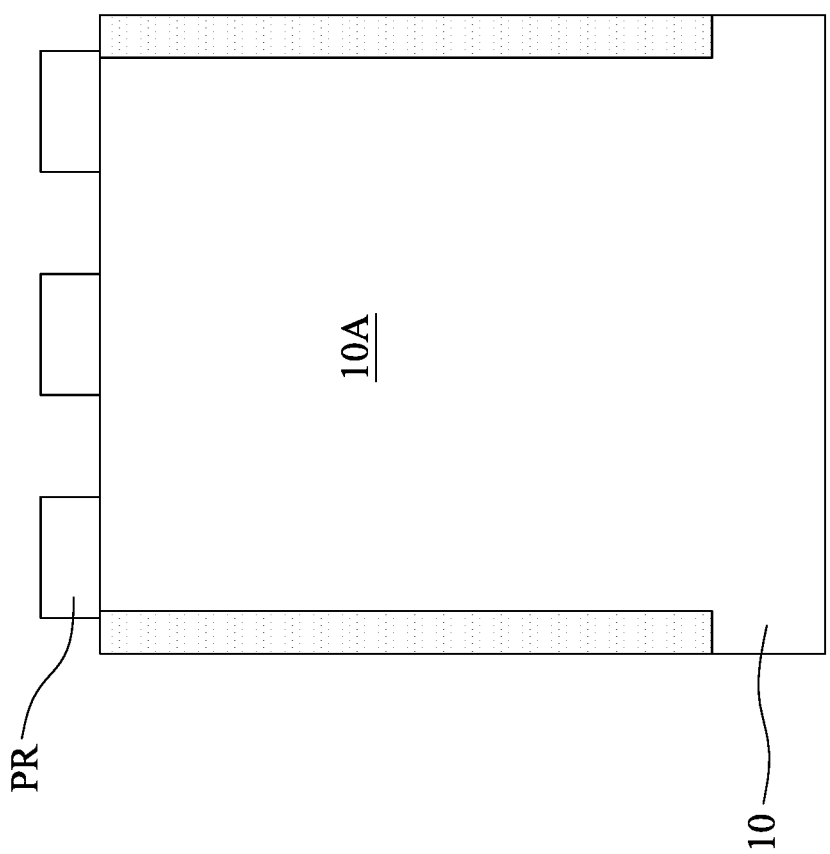

FIGS. 4A-4B illustrate one stage of a method of manufacturing a semiconductor structure 1, in accordance with some embodiments of the present disclosure. In some embodiments, FIG. 4B is a cross-section along the line 4B-4B' of FIG. 4A.

A patterned photoresist layer PR may be disposed over the isolation structure 20 and the active regions 10A of the semiconductor substrate 10. A photoresist layer may be coated over the isolation structure 20 and the active regions 10A of the semiconductor substrate 10, and then the photoresist layer may be exposed and developed to form the patterned photoresist layer PR having a plurality of openings to exposed portions of the isolation structure 20 and the active regions 10A of the semiconductor substrate 10. The patterned photoresist layer PR may have a predetermined pattern for forming the trenches (e.g., the trenches 30 which will be discussed hereinafter) passing through the active regions 10A and the isolation structure 20. The openings of the patterned photoresist layer PR correspond to the locations where the trenches (e.g., the trenches 30 which will be discussed hereinafter) passing through the active regions 10A and the isolation structure 20 are formed subsequently.

Figure 5A:
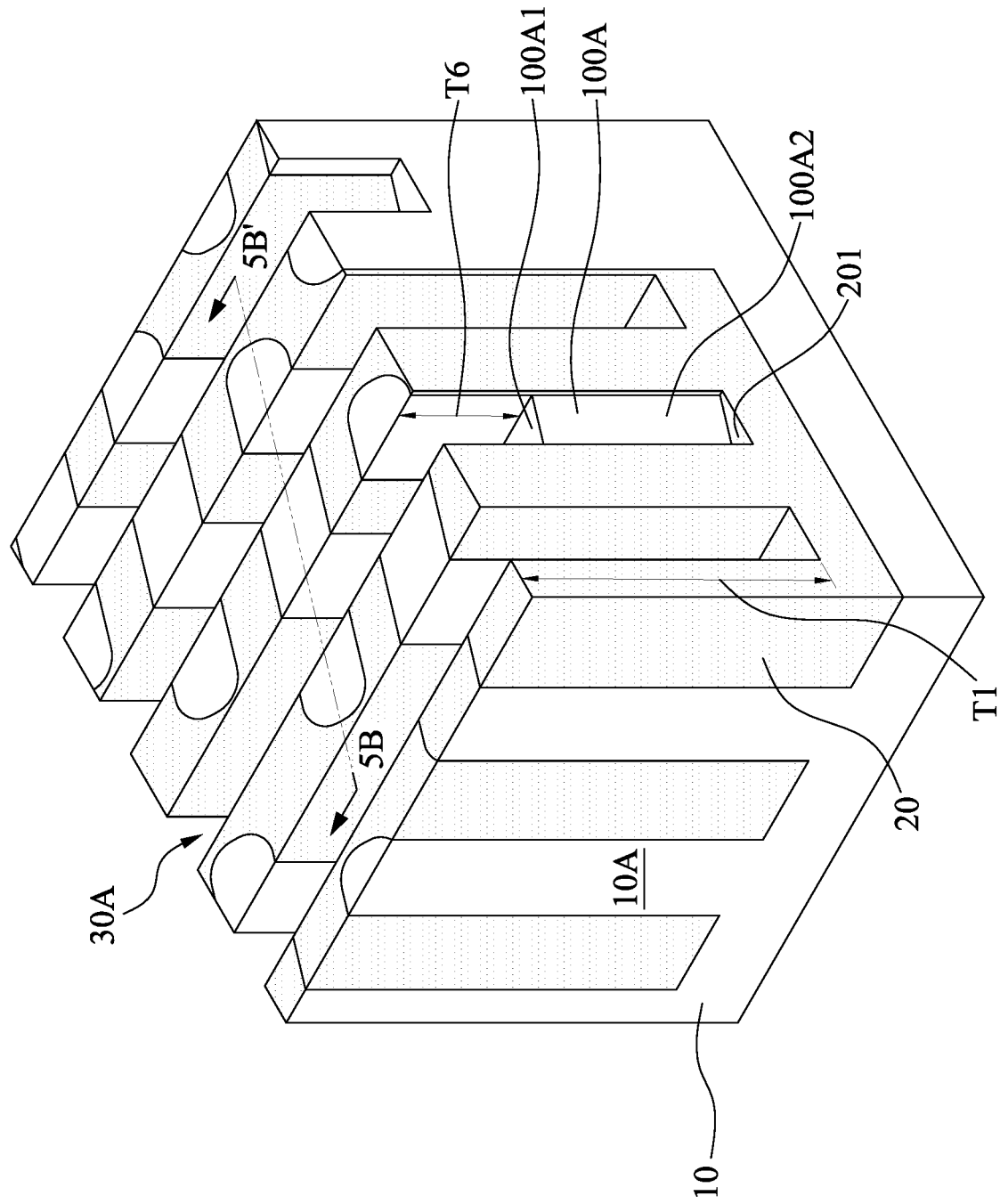
FIGS. 5A-5B illustrate one stage of a method of manufacturing a semiconductor structure, in accordance with some embodiments of the present disclosure.
Figure 5B:
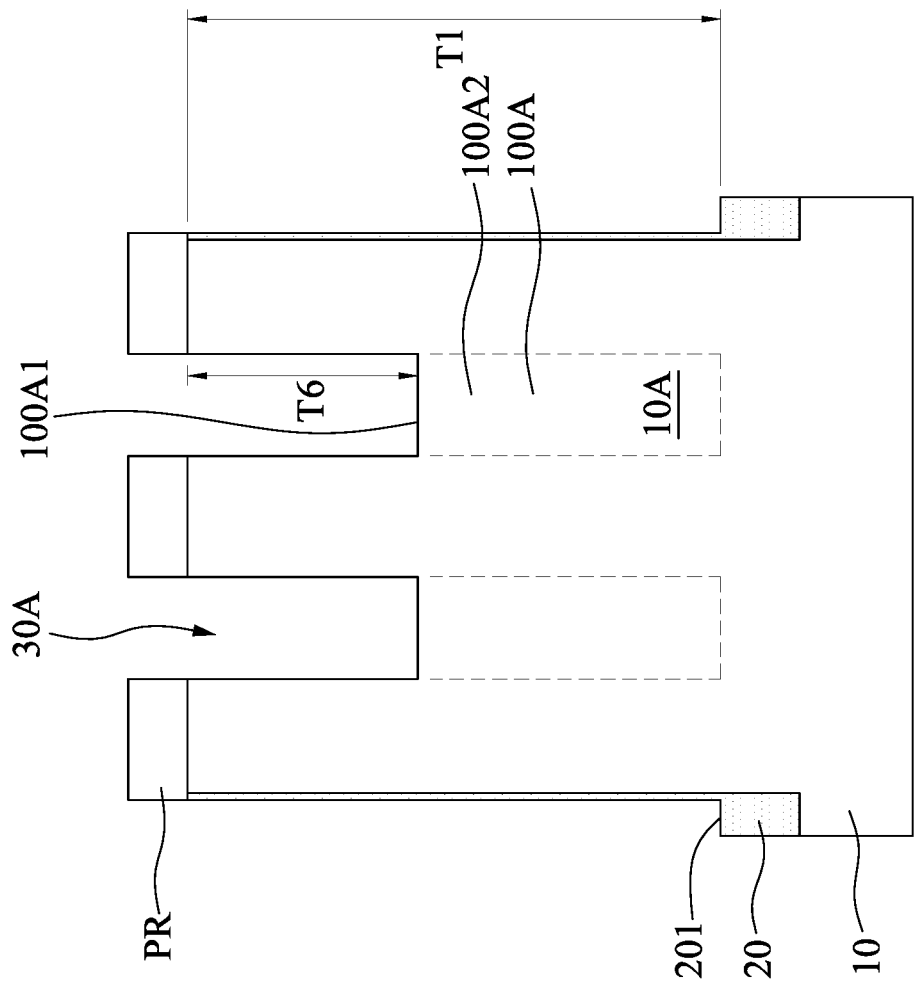

FIGS. 5A-5B illustrate one stage of a method of manufacturing a semiconductor structure 1, in accordance with some embodiments of the present disclosure. In some embodiments, FIG. 5B is a cross-section along the line 5B-5B' in FIG. 5A. It should be noted that the patterned photoresist layer PR is omitted from FIG. 5A for clarity.

In some embodiments, a portion of the active region 10A of the semiconductor substrate 10 is removed to form a trench 30A and an initial fin structure 100A in the trench 30A. In some embodiments, the active region 10A and the isolation structure 20 are etched through the openings of the patterned photoresist layer PR to form one or more trenches 30A penetrating the active region 10A and the isolation structure 20. In some embodiments, an anisotropic etching operation may be performed to form the trench 30A and the initial fin structure 100A therein. In some embodiments, the active region 10A of the semiconductor substrate 10 is anisotropically dry-etched, using a reactive ion etching (RIE) process, to form the trench 30A and the initial fin structure 100A in the trench 30A.

In some embodiments, the initial fin structure 100A has a planar upper surface 100A1. In some embodiments, the initial fin structure 100A has one or more lateral surfaces (e.g., the lateral surface 100A2) that are substantially perpendicular to the upper surface 100A1 of the initial fin structure 100A.

In some embodiments, the trench 30A passes further through the isolation structure 20. In some embodiments, an opening of the trench 30A is spaced apart from the upper surface 100A1 of the initial fin structure 100A by a distance T6. In some embodiments, the distance T6 is from about 5 nm to about 50 nm.

Figure 6A:
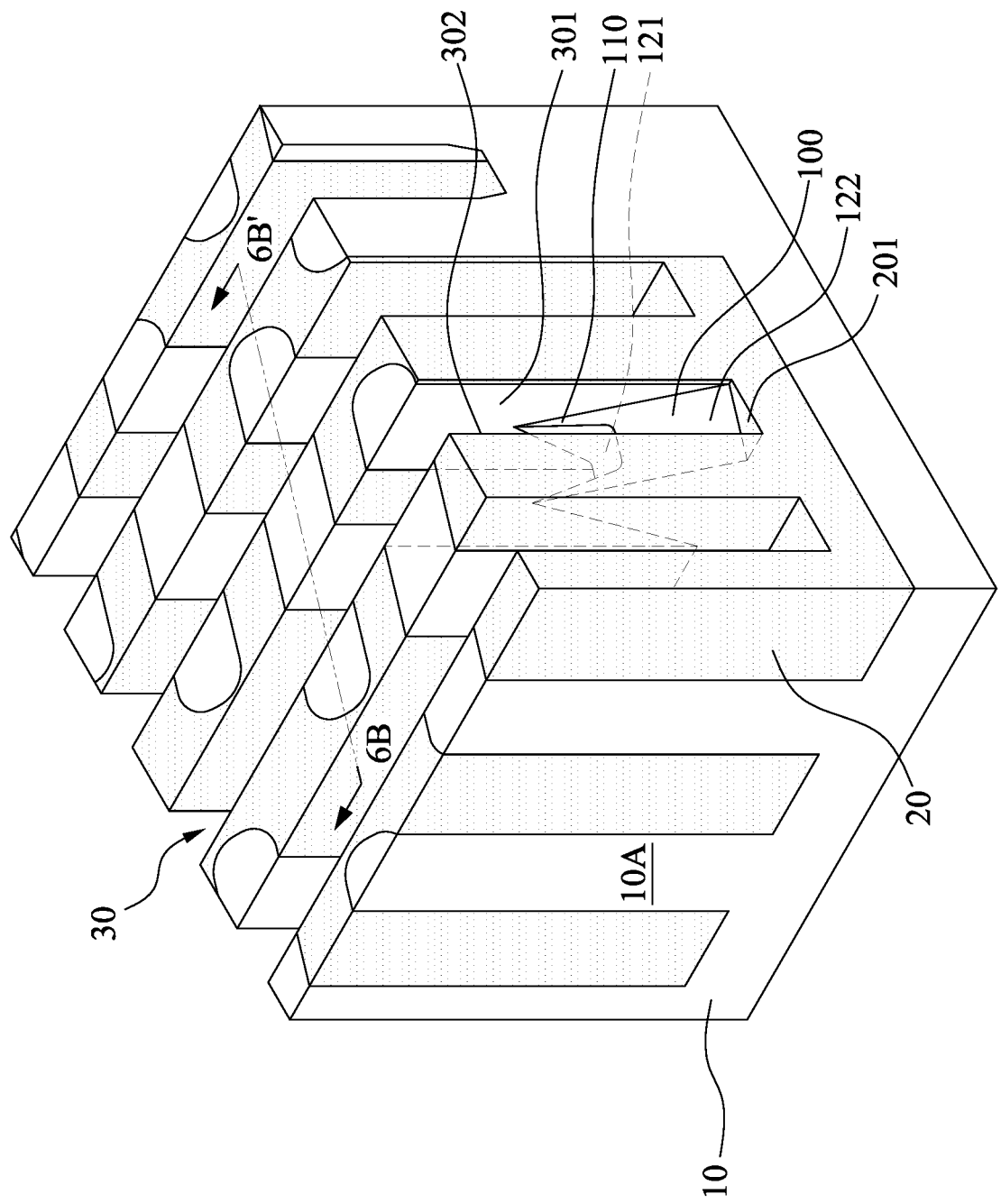
FIGS. 6A-6B illustrate one stage of a method of manufacturing a semiconductor structure, in accordance with some embodiments of the present disclosure.
Figure 6B:
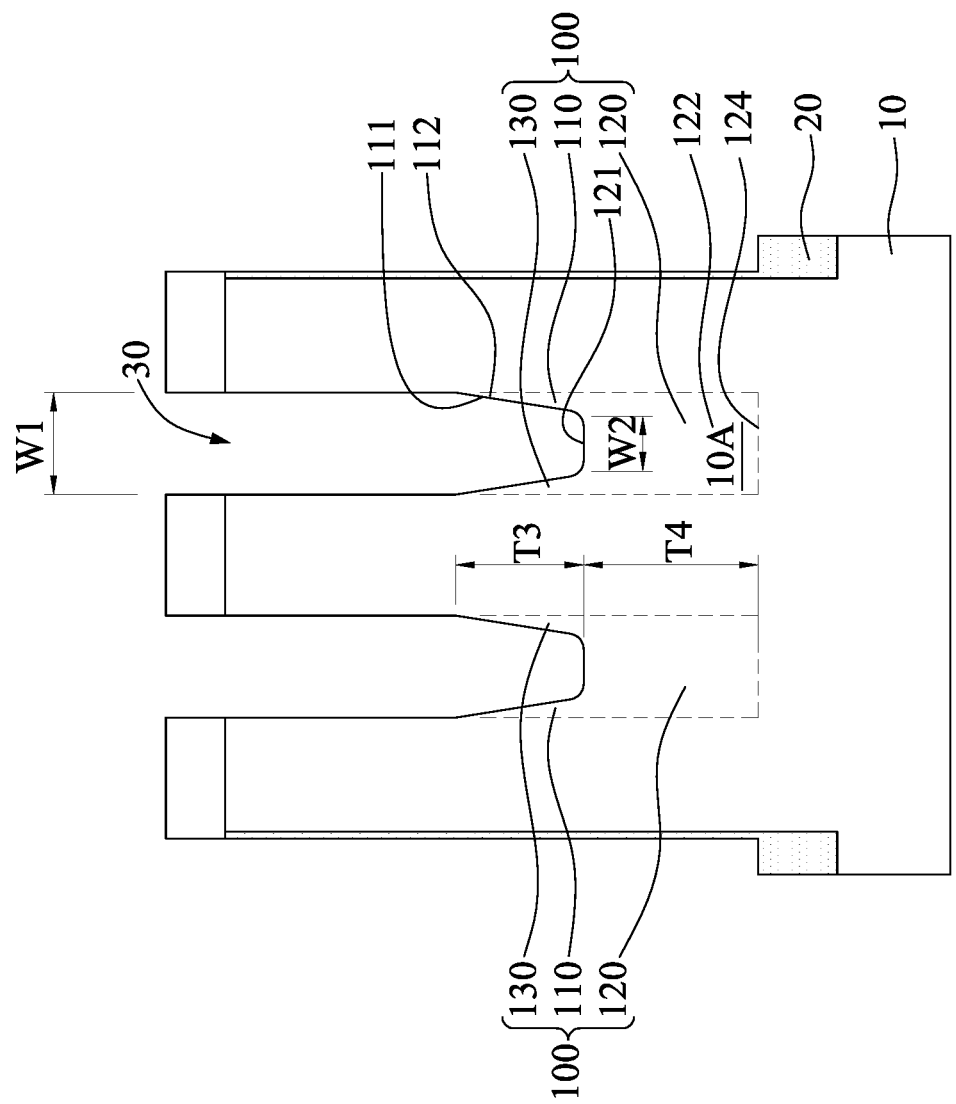

FIGS. 6A-6B illustrate one stage of a method of manufacturing a semiconductor structure 1, in accordance with some embodiments of the present disclosure. In some embodiments, FIG. 6B is a cross-section along the line 6B-6B' in FIG. 6A. It should be noted that the patterned photoresist layer PR is omitted from FIG. 6A for clarity.

In some embodiments, a portion of the initial fin structure 100A is removed to form a fin structure 100 in a trench 30. In some embodiments, the as-formed fin structure 100 includes a body portion 120 and protrusions 110 and 130. In some embodiments, an isotropic etching operation may be performed to form the fin structure 100.

In some embodiments, the initial fin structure 100A is isotropically etched, using a dry-etching process or a wet-etching process, to form the fin structure 100 in the trench 30. In some embodiments, the isotropic etching operation has a relatively high etching selectivity between the semiconductor substrate 10 and the isolation structure 20, and thus the isolation structure 20 is only slightly etched or not at all in the isotropic etching operation.

In some embodiments, the trench 30A, the trench 30A, the initial fin structure 100A in the trench 30A, and the fin structure 100 in the trench 30 may be formed by etching according to the same patterned photoresist layer PR. In some embodiments, the isotropic etching operation is performed after the anisotropic etching operation is performed on the active region of the semiconductor substrate.

In some embodiments, the fin structure 100 includes a body portion 120 and protrusions 110 and 130. In some embodiments, the body portion 120 is connected to the protrusions 110 and 130.

In some embodiments, the body portion 120 of the fin structure 100 may have an upper surface 121, a bottom surface 124 opposite to the upper surface 121, and slanted surfaces 122 and 123 (also referred to as "slanted lateral surfaces"). In some embodiments, an area of the upper surface 121 is less than an area of the bottom surface 124. In some embodiments, the slanted surface 122 of the body portion 120 extends from the upper surface 121 to the bottom surface 124. In some embodiments, the slanted surface 123 of the body portion 120 extends from the upper surface 121 to the bottom surface 124. In some embodiments, the slanted surface 122 of the body portion 120 extends from the upper surface 121 to a bottom 303 (also referred to as "a bottom surface") of the trench 30. In some embodiments, the slanted surface 123 of the body portion 120 extends from the upper surface 121 to the bottom 303 of the trench 30.

In some embodiments, the trench 30 passes further through the isolation structure 20. In some embodiments, a portion of the isolation structure 20 is in the trench 30 and has an upper surface 201, and the slanted surface 122 of the body portion 120 extends from the upper surface 121 of the body portion 120 to the upper surface 201 of the isolation structure 20 in the trench 30. In some embodiments, the slanted surface 123 of the body portion 120 extends from the upper surface 121 of the body portion 120 to the upper surface 201 of the isolation structure 20 in the trench 30.

In some embodiments, the protrusion 110 of the fin structure 100 protrudes from the upper surface 121 of the body portion 120. In some embodiments, the protrusion 110 extends upwards along the sidewall 301 of the trench 30. In some embodiments, the protrusion 110 includes a plurality of slanted surfaces (e.g., slanted surfaces 111, 112, and 123). In some embodiments, the slanted surface 111 of the protrusion 110 is connected to the upper surface 121 of the body portion 120. In some embodiments, the slanted surface 112 of the protrusion 110 is connected to the slanted surface 122 of the body portion 120. In some embodiments, the slanted surface 113 of the protrusion 110 is connected to the slanted surface 123 of the body portion 120. In some embodiments, the protrusion 110 may be tapered or may include a tapered portion. In some embodiments, the protrusion 110 has a tapered shape.

In some embodiments, the protrusion 130 of the fin structure 100 protrudes from the upper surface 121 of the body portion 120. In some embodiments, the protrusion 130 extends upwards along the sidewall 302 of the trench 30. In some embodiments, the protrusion 130 includes a plurality of slanted surfaces (e.g., slanted surfaces 131, 132, and 133). In some embodiments, the slanted surface 131 of the protrusion 130 faces the slanted surface 111 of the protrusion 110. In some embodiments, the slanted surface 131 of the protrusion 130 is connected to the upper surface 121 of the body portion 120. In some embodiments, the slanted surface 132 of the protrusion 130 is connected to the slanted surface 122 of the body portion 120. In some embodiments, the slanted surface 133 of the protrusion 130 is connected to the slanted surface 123 of the body portion 120. In some embodiments, the protrusion 130 may be tapered or may include a tapered portion. In some embodiments, the protrusion 130 has a tapered shape.

In some embodiments, the protrusion 110 and the protrusion 130 are located at opposite sides of the upper surface 121 of the body portion 120. In some embodiments, the protrusions 110 and 130 protrude along the same direction or orientation (e.g., the Z axis). In some embodiments, the slanted surface 112 of the protrusion 110, the slanted surface 132 of the protrusion 130, and the slanted surface 122 of the body portion 120 form a continuous plane or surface. In some embodiments, the slanted surface 113 of the protrusion 110, the slanted surface 133 of the protrusion 130, and the slanted surface 123 of the body portion 120 form a continuous plane or surface.

Figure 7A:
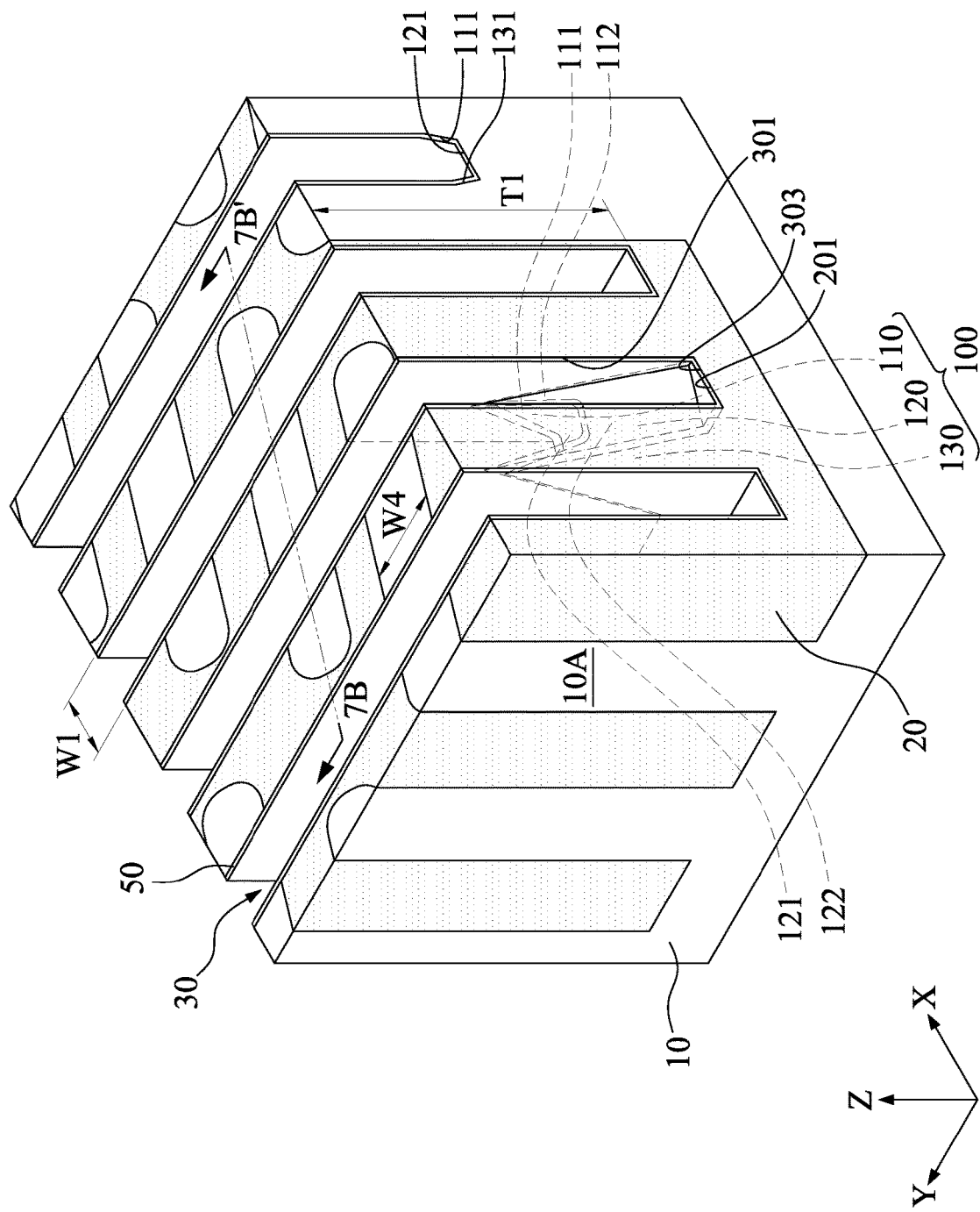
FIGS. 7A-7B illustrate one stage of a method of manufacturing a semiconductor structure, in accordance with some embodiments of the present disclosure.
Figure 7B:
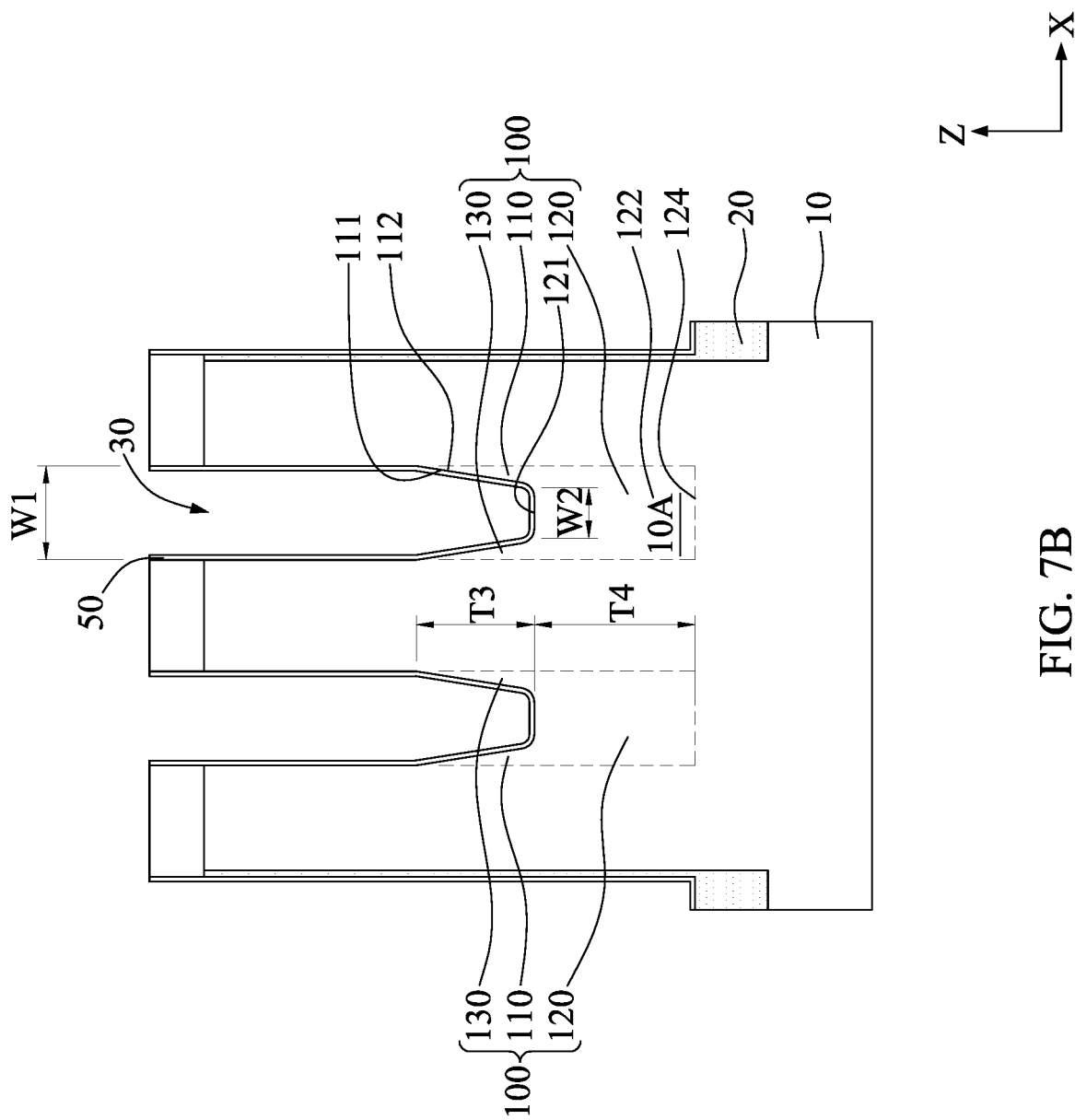

FIGS. 7A-7B illustrate one stage of a method of manufacturing a semiconductor structure 1, in accordance with some embodiments of the present disclosure. In some embodiments, FIG. 7B is a cross-section along the line 7B-7B' in FIG. 7A. It should be noted that the patterned photoresist layer PR is omitted from FIG. 7A for clarity.

In some embodiments, a dielectric layer 50 is formed conformally on the fin structure 100 and the sidewalls 301 and 302 of the trench 30.

In some embodiments, the dielectric layer 50 is deposited on the fin structure 100. In some embodiments, the dielectric layer 50 is deposited on the fin structure 100 using a CVD process, an ALD process, or the like. In some embodiments, the dielectric layer 50 deposited on a topmost surface of the patterned photoresist layer PR may be removed using an etching process, for example, while the dielectric layer 50 deposited on the sidewalls 301 and 302 of the trench 30 is left in place. In some other embodiments, the dielectric layer 50 may be grown on the exposed portion of the substrate 10 (i.e., the sidewalls 301 and 302 of the trench 30) using a thermal oxidation process.

In some embodiments, the dielectric layer 50 may be formed of or include, for example, silicon oxide, silicon nitride, silicon oxynitride, silicon nitride oxide, fluoride-doped silicate, or a high-k material, or the like. In some embodiments, the dielectric layer 50 may be formed of or include, barium strontium titanate, lead zirconium titanate, titanium oxide, aluminum oxide, hafnium oxide, yttrium oxide, zirconium oxide, or the like.

Figure 8A:
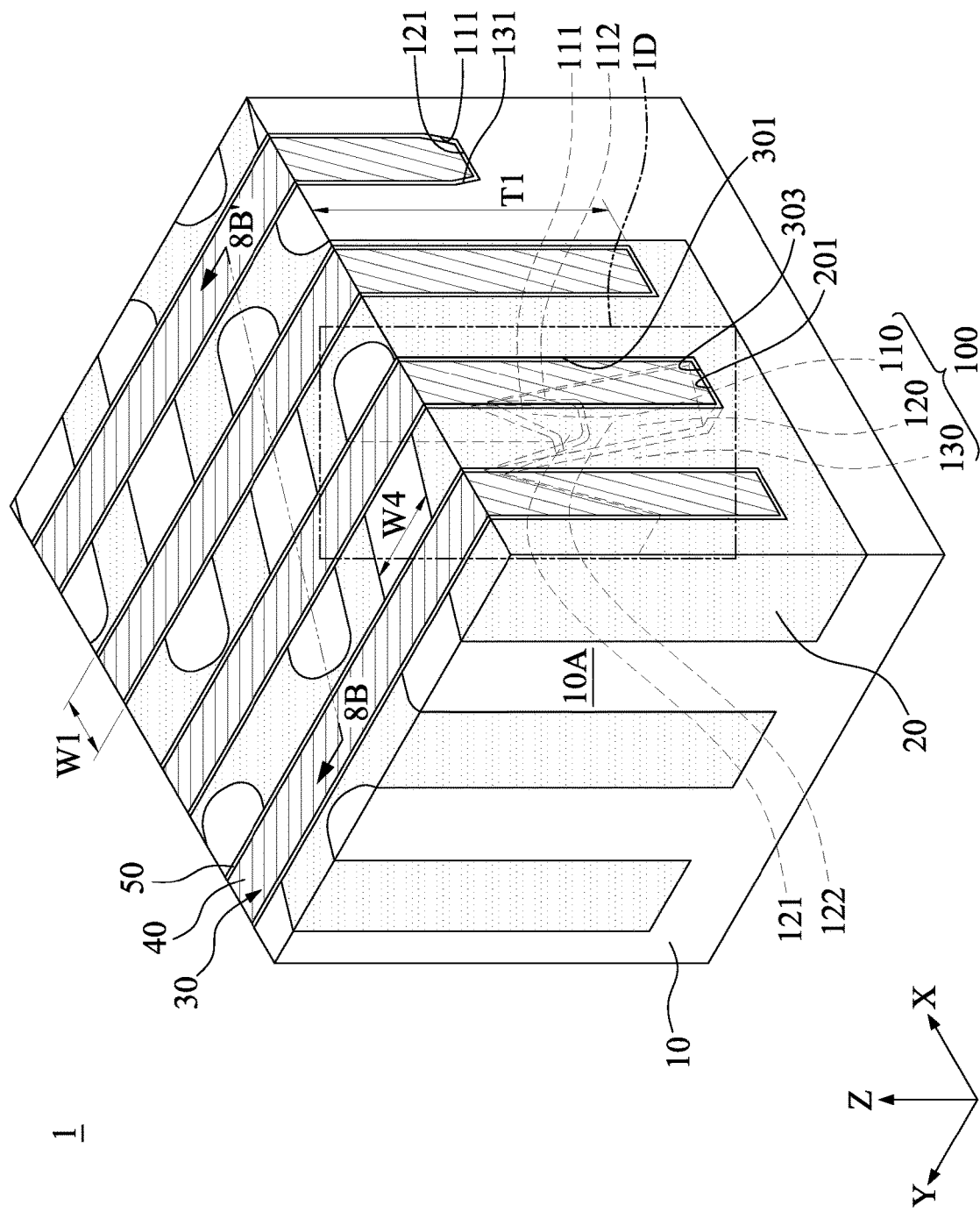
FIGS. 8A-8B illustrate one stage of a method of manufacturing a semiconductor structure, in accordance with some embodiments of the present disclosure.
Figure 8B:
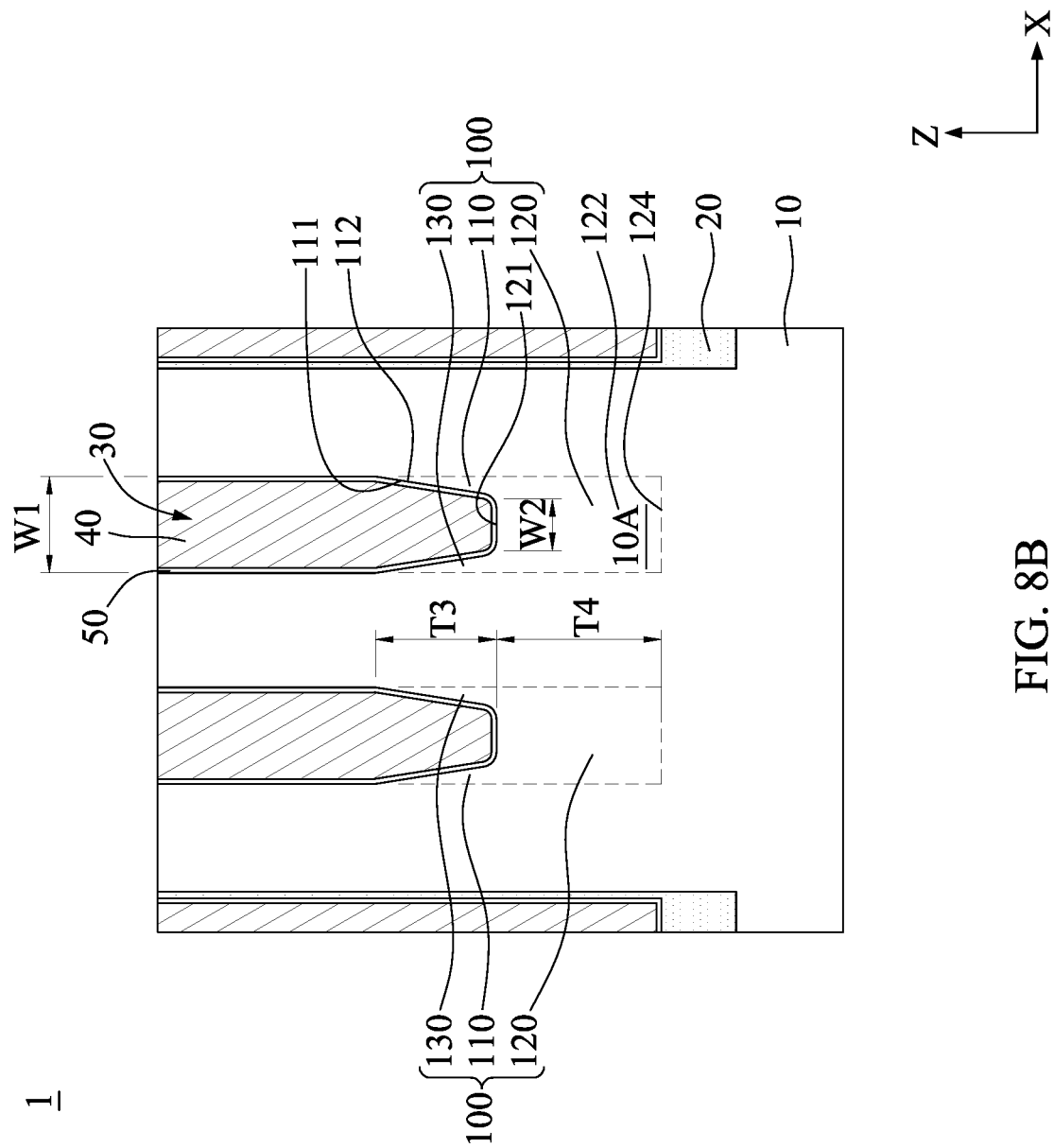

FIGS. 8A-8B illustrate one stage of a method of manufacturing a semiconductor structure 1, in accordance with some embodiments of the present disclosure. In some embodiments, FIG. 8B is a cross-section along the line 8B-8B' in FIG. 8A.

In some embodiments, a conductive element 40 is formed conformally on the body portion 120 and the protrusions 110 and 130 of the fin structure 100 and on the sidewalls 301 and 302 of the trench 30. In some embodiments, a conductive element 40 is formed conformally on the dielectric layer 50 in the trench 30.

In some embodiments, the conductive element 40 is deposited on the dielectric layer 50. In some embodiments, the conductive element 40 is formed on the dielectric layer 50 using CVD, PVD, or ALD. In some embodiments, the patterned photoresist layer PR is removed. In some embodiments, the patterned photoresist layer PR is removed using by ashing or a strip process.

In some embodiments, the conductive element 40 includes a conductive material, for example, doped polysilicon, a metal, or a metal silicide. The metal may be, for example, aluminum, copper, tungsten, cobalt, or an alloy thereof. The metal silicide may be, for example, nickel silicide, platinum silicide, titanium silicide, molybdenum silicide, cobalt silicide, tantalum silicide, tungsten silicide, or the like.

Figure 9:
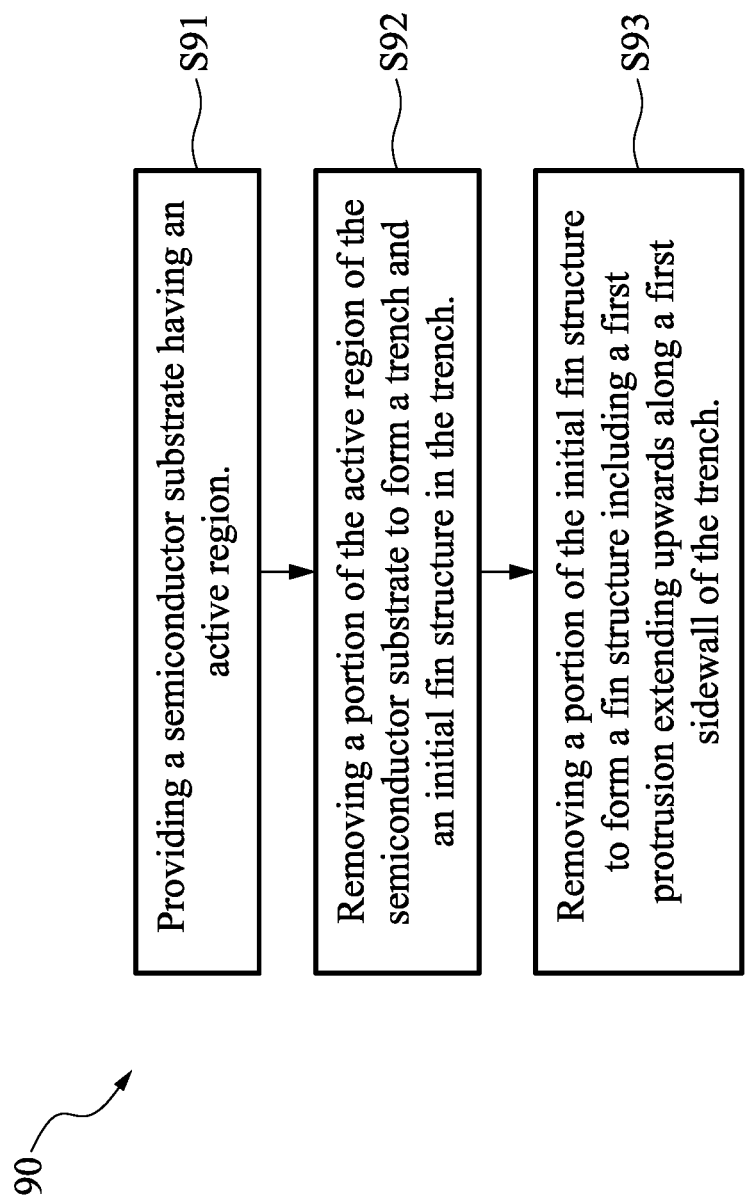
FIG. 9 is a flowchart illustrating a method of manufacturing a semiconductor structure, in accordance with some embodiments of the present disclosure.

FIG. 9 is a flowchart illustrating a method 90 of manufacturing a semiconductor structure, in accordance with some embodiments of the present disclosure.

The method 90 begins with operation S91 in which a semiconductor substrate having an active region is provided.

The method 90 continues with operation S92 in which a portion of the active region of the semiconductor substrate is removed to form a trench and an initial fin structure.

The method 90 continues with operation S93 in which a portion of the initial fin structure is removed to form a fin structure. The fin structure includes a first protrusion extending upwards along a first sidewall of the trench.

The method 90 is merely an example, and is not intended to limit the present disclosure beyond what is explicitly recited in the claims. Additional operations can be provided before, during, or after each operations of the method 90, and some operations described can be replaced, eliminated, or moved around for additional embodiments of the method. In some embodiments, the method 90 can include further operations not depicted in FIG. 9. In some embodiments, the method 90 can include one or more operations depicted in FIG. 9.

One aspect of the present disclosure provides a semiconductor structure including a semiconductor substrate. The semiconductor substrate has an active region defined by an isolation structure. A trench passes through the active region and the isolation structure. The active region of the semiconductor substrate includes a fin structure in the trench. The fin structure includes a first protrusion extending upwards along a first sidewall of the trench.

Another aspect of the present disclosure provides a semiconductor structure including a semiconductor substrate and a conductive element. The semiconductor substrate has an active region including a fin structure. The fin structure includes a body portion and a first tapered portion. The first tapered portion protrudes from an upper surface of the body portion. The conductive element is disposed on the body portion and the first tapered portion of the fin structure.

Another aspect of the present disclosure provides a method of manufacturing a semiconductor structure. The method includes providing a semiconductor substrate having an active region. The method also includes removing a portion of the active region of the semiconductor substrate to form a trench and an initial fin structure. The method further includes removing a portion of the initial fin structure to form a fin structure including a first protrusion extending upwards along a first sidewall of the trench.

In the design of a fin structure including a protrusion extending upwards along a sidewall of a trench in which the fin structure is formed, the protrusion can provide an extension of the fin structure that can be further covered by a conductive element. Since the electric field is relatively high adjacent to the sidewall of the trench (i.e., where a doped region or a source/drain region of a cell transistor is located), the protrusion covered by the conductive element can increase the area covered by the conductive element (i.e., the gate control region). Therefore, an additional gate control region can be generated, and the gate control over the channel of the semiconductor structure (i.e. the transistor) can be improved.

Although the present disclosure and its advantages have been described in detail, it should be understood that various changes, substitutions and alterations can be made herein without departing from the spirit and scope of the disclosure as defined by the appended claims. For example, many of the processes discussed can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method of manufacturing a semiconductor structure, comprising:
   providing a semiconductor substrate having an active region;
   forming a fin structure in the active region, the fin structure comprising:
   a body portion; and
   a first tapered portion protruding from an upper surface of the body portion; and
   forming a conductive element on the body portion and the first tapered portion of the fin structure;
   wherein the body portion of the fin structure has a first slanted surface and a second slanted surface extending from the upper surface of the body portion to an underside surface of the body portion.

2. The method of claim 1, further comprising: forming a trench passes through the active region, and the fin structure is in the trench.

3. The method of claim 2, further comprising:
   forming an isolation structure defining the active region, wherein the trench passes further through the isolation structure.

4. The method of claim 3, wherein a portion of the isolation structure in the trench has an upper surface, and the body portion of the fin structure has a slanted surface extending from the upper surface of the body portion to the upper surface of the isolation structure in the trench.

5. The method of claim 1, further comprising:
   forming a dielectric layer between the conductive element and the first tapered portion of the fin structure.

6. The method of claim 5, wherein the first tapered portion comprises a plurality of slanted surfaces connected to the body portion.

7. The method of claim 6, wherein the dielectric layer is conformally formed on the plurality of slanted surfaces of the first tapered portion.

8. The method of claim 1, wherein the first tapered portion comprises a plurality of slanted surfaces connected to the body portion, and the conductive element is conformally formed on the plurality of slanted surfaces of the first tapered portion.

9. The method of claim 1, wherein the conductive element is conformally formed on the first slanted surface and the second slanted surface of the body portion.

10. A method of manufacturing a semiconductor structure, comprising:
    providing a semiconductor substrate having an active region;
    removing a portion of the active region of the semiconductor substrate to form a trench and an initial fin structure in the trench; and
    removing a portion of the initial fin structure to form a fin structure comprising a first protrusion extending upwards along a first sidewall of the trench;
    wherein forming the initial fin structure comprises performing an anisotropic etching operation on the active region of the semiconductor substrate, and forming the fin structure comprises performing an isotropic etching operation on the active region of the semiconductor substrate after performing the anisotropic etching operation.

11. The method of claim 10, wherein forming the trench and the initial fin structure in the trench and forming the fin structure are performed by etching according to a same patterned photoresist layer.

12. The method of claim 10, wherein forming the trench and the initial fin structure in the trench is performed by an anisotropic etching operation.

13. The method of claim 12, further comprising:
    forming an isolation structure defining the active region, wherein the trench passes further through the isolation structure.

14. The method of claim 10, wherein forming the fin structure comprising the first protrusion extending upwards along the first sidewall of the trench is performed by an isotropic etching operation.

15. The method of claim 14, further comprising:
    forming an isolation structure defining the active region, wherein the trench passes further through the isolation structure, and the fin structure has a slanted surface extending from an upper surface to an upper surface of the isolation structure in the trench.

16. The method of claim 10, further comprising:
    forming a conductive element conformally on the first protrusion of the fin structure and on the first sidewall of the trench.

17. The method of claim 10, further comprising:
    forming a dielectric layer conformally on the fin structure and the first sidewall of the trench.

18. The method of claim 17, further comprising:
    forming a conductive element conformally on the dielectric layer in the trench.

* * * * *